(12) United States Patent
Padhye et al.

(10) Patent No.: US 7,346,820 B2
(45) Date of Patent: Mar. 18, 2008

(54) TESTING OF DATA RETENTION LATCHES IN CIRCUIT DEVICES

(75) Inventors: Milind P. Padhye, Austin, TX (US); Darrell L. Carder, Dripping Springs, TX (US); Bhoodev Kumar, Austin, TX (US); Bart J. Martinec, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 191 days.

(21) Appl. No.: 11/388,154

(22) Filed: Mar. 23, 2006

(65) Prior Publication Data

US 2007/0226561 A1   Sep. 27, 2007

(51) Int. Cl.
*G01R 31/28* (2006.01)
(52) U.S. Cl. ..................................................... 714/726
(58) Field of Classification Search .............. 714/726, 714/727, 729
See application file for complete search history.

(56) References Cited

U.S. PATENT DOCUMENTS

| | | | |
|---|---|---|---|
| 5,075,570 | A | 12/1991 | Shewchuk et al. |
| 5,162,667 | A | 11/1992 | Yasui et al. |
| 5,598,421 | A | 1/1997 | Tran et al. |
| 5,708,773 | A | 1/1998 | Jeppesen, III et al. |
| 5,793,776 | A | 8/1998 | Quereshi et al. |
| 6,141,237 | A | 10/2000 | Eliason et al. |
| 6,195,754 | B1 | 2/2001 | Jardine et al. |
| 6,243,842 | B1 | 6/2001 | Slezak et al. |
| 6,266,793 | B1 | 7/2001 | Mozdzen et al. |
| 6,362,675 | B1 | 3/2002 | Alwais |
| 6,807,644 | B2 | 10/2004 | Reis et al. |
| 6,948,147 | B1 | 9/2005 | New et al. |
| 7,051,255 | B2 * | 5/2006 | Gschwind ................ 714/726 |
| 2002/0159305 | A1 | 10/2002 | Yoo et al. |
| 2003/0067322 | A1 | 4/2003 | Stan et al. |

(Continued)

FOREIGN PATENT DOCUMENTS

EP     1 098 324 A2    5/2001

(Continued)

OTHER PUBLICATIONS

Levy, Paul S. "Power-Down Integrated Circuit Built-In Self-Test Structures"; 1991 IEEE VLSI Test Symposium; IEEE 1991; Paper 2.1; pp. 30-33.

(Continued)

*Primary Examiner*—James C. Kerveros (57) ABSTRACT

A circuit device having data retention latches utilizes a test interface and system test controller to control one or more components of the circuit device to ensure proper conditions for testing the data retention latches. The data retention latches each include a scan component that is part of a scan chain, a first latching component that is powered in a first voltage domain and a second latching component that is powered in a second voltage domain, where one of the voltage domains can be effectively shut down when the circuit device is placed in a low-voltage mode. The system test controller can control a scan controller used to scan test data in and out of the scan chain. The system test controller further can control a power controller used to manage a power down sequence and a power up sequence so as to ensure that the data retention latches are not placed in spurious states.

20 Claims, 6 Drawing Sheets

U.S. PATENT DOCUMENTS

| | | | |
|---|---|---|---|
| 2003/0172333 A1 | 9/2003 | Wehage | |
| 2003/0188241 A1* | 10/2003 | Zyuban et al. | 714/726 |
| 2003/0226077 A1* | 12/2003 | Zyuban et al. | 714/726 |
| 2004/0006729 A1* | 1/2004 | Pendurkar | 714/733 |
| 2005/0218943 A1 | 10/2005 | Padhye et al. | |
| 2007/0208967 A1* | 9/2007 | Pedersen | 714/718 |

FOREIGN PATENT DOCUMENTS

| | | |
|---|---|---|
| WO | WO 2004/066050 A1 | 8/2004 |

OTHER PUBLICATIONS

Oshana, Rob, "Introduction to JTAG," Embedded Systems Design, http://www.embedded.com/showArticle.jhtml?articleID=9900782, Oct. 29, 2002, 4 pages.

Shigematsu, Satoshi et al.; "A 1-V High-Speed MTCMOS Circuit Scheme for Power-Down Application Circuits"; IEEE Journal of Solid-State Circuits; vol. 32, No. 6; Jun. 1997; pp. 861-869.

Zyuban, Victor et al.; "Low Power Integrated Scan-Retention Mechanism"; ISLPED 2002; Aug. 12-14, 2002; pp. 98-102; ACM (18 page related presentation included).

INTEL, "Designing for On-Board Programming Using the IEEE 1149.1 (JTAG) Access Port," AP-603, Nov. 1996, 165 pages.

* cited by examiner

TESTING OF DATA RETENTION LATCHES IN CIRCUIT DEVICES

FIELD OF THE DISCLOSURE

The present application relates generally to circuit devices and more particularly to testing circuit devices.

BACKGROUND

Circuit devices often implement data retention latches (also commonly referred to as retention flip-flops) to retain data during a low power state. However, due to their specific operating characteristics, conventional systems for testing (i.e., debugging) the data retention latches typically implement a relatively large number of pins having a custom arrangement and require complex test sequences driven to these pins. Moreover, this type of testing often makes it difficult to test a circuit device in the field as a debugging system suitable to interface with the custom pin interface and the complex test sequences typically are unavailable outside of the manufacturer's facility. Accordingly, an improved technique for testing circuit devices implementing data retention latches would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In accordance with one aspect of the present disclosure, a circuit device includes a circuit component having a plurality of data retention latches. Each data retention latch has a scan chain component, a first latching component operated at a first voltage and a second latching component operated at a second voltage different than the first voltage. The circuit device further includes a scan controller having a first input to receive a scan test control signal, a first output coupled to the circuit component to provide a first scan chain data to the scan chain components of the plurality of data retention latches responsive to the scan test control signal, a second input coupled to the circuit component to receive a second scan chain data from the scan chain components of the plurality of data retention latches based on the first scan chain data, and a second output to provide the second scan chain data. The circuit device also includes a power controller having an input to receive a power control signal, first output to selectively provide the first voltage responsive to the power control signal, and a second output to selectively provide the second voltage responsive to the power control signal. The circuit device additionally includes a test interface having a first input to receive scan test data and an output to provide test results data. The circuit device further includes a system test controller coupled to the test interface. The system test controller including a first input coupled to the second output of the scan controller to receive the second scan chain data, wherein the test results data includes the second scan chain data, a first output coupled to a third input of the scan controller to provide the scan test data, wherein the scan test data includes the first scan chain data, a second output coupled to the first input of the scan controller to provide the scan test control signal, and a third output coupled to the input of the power controller to provide the power control signal.

In accordance with another aspect of the present disclosure, a method includes receiving, at a test interface of a circuit device, scan test data. The method further includes providing a first voltage and a second voltage to a sequence of data retention latches. Each data retention latch has a corresponding scan chain component of a scan chain, a first latching component operated at the first voltage, and a second latching component operated at the second voltage. The method further includes shifting a first scan test data into the scan chain subsequent to providing the first voltage and the second voltage. The method additionally includes terminating provision of the first voltage to the first latching components of the plurality of data retention latches subsequent to shifting the scan test data into the scan chain. The method further includes providing the first voltage to the first latching components of the plurality of data retention latches subsequent to terminating provision of the first voltage and shifting a second scan test data out of the scan chain subsequent to providing the first voltage, wherein the second scan test data is based on the first scan test data.

In accordance with yet another aspect of the present disclosure, a device includes a test interface to receive scan test data and a scan chain including a sequence of data retention latches. Each data retention latch having a corresponding scan chain component of a scan chain, a first latching component operated at a first voltage, and a second latching component operated at a second voltage. The device further includes means for providing the first voltage and the second voltage to the sequence of data retention latches and means for shifting a first scan test data into the scan chain subsequent to providing the first voltage and the second voltage. The device also includes means for terminating provision of the first voltage to the first latching components of the plurality of data retention latches subsequent to shifting the scan test data into the scan chain and means for providing the first voltage to the second latching components of the plurality of data retention latches subsequent to terminating provision of the first voltage. The device additionally includes means for shifting a second scan test data out of the scan chain subsequent to providing the first voltage, wherein the second scan test data is based on the first scan test data.

FIGS. 1-6 illustrate exemplary techniques for implementing testing capabilities for data retention latches in a circuit device. A circuit device having data retention latches utilizes a test interface and system test controller to control one or more components of the circuit device to ensure proper conditions for testing the data retention latches. The data retention latches, in one embodiment, each include a scan component that is part of a scan chain, a first latching component that is powered in a first voltage domain and a second latching component that is powered in a second voltage domain, where one of the voltage domains can be effectively shut down when the circuit device is placed in a low-voltage mode. Accordingly, the system test controller can control a scan controller used to scan test data in and out of the scan chain and a clock controller used to control which clock (e.g., the device clock or an eternally-provided test clock) is provided to the data retention latches. The system test controller further can control a power controller used to manage a power down sequence and a power up sequence so as to ensure that the data retention latches are not placed in spurious states. Further, in at least one embodiment, the system test controller and test interface are substantially compliant with one or more scan testing interface standards, such as the Institute of Electronic and Electrical Engineers (IEEE) 1149.1 Joint Test Action Group standard (hereinafter, the "IEEE 1149.1 standard" or the "JTAG standard"). This use of a standard test interface and the integration of the test control circuitry into the circuit device facilitates device debugging in the field as a debug system utilizing a standard test interface can be used for debugging purposes.

Figure 1:
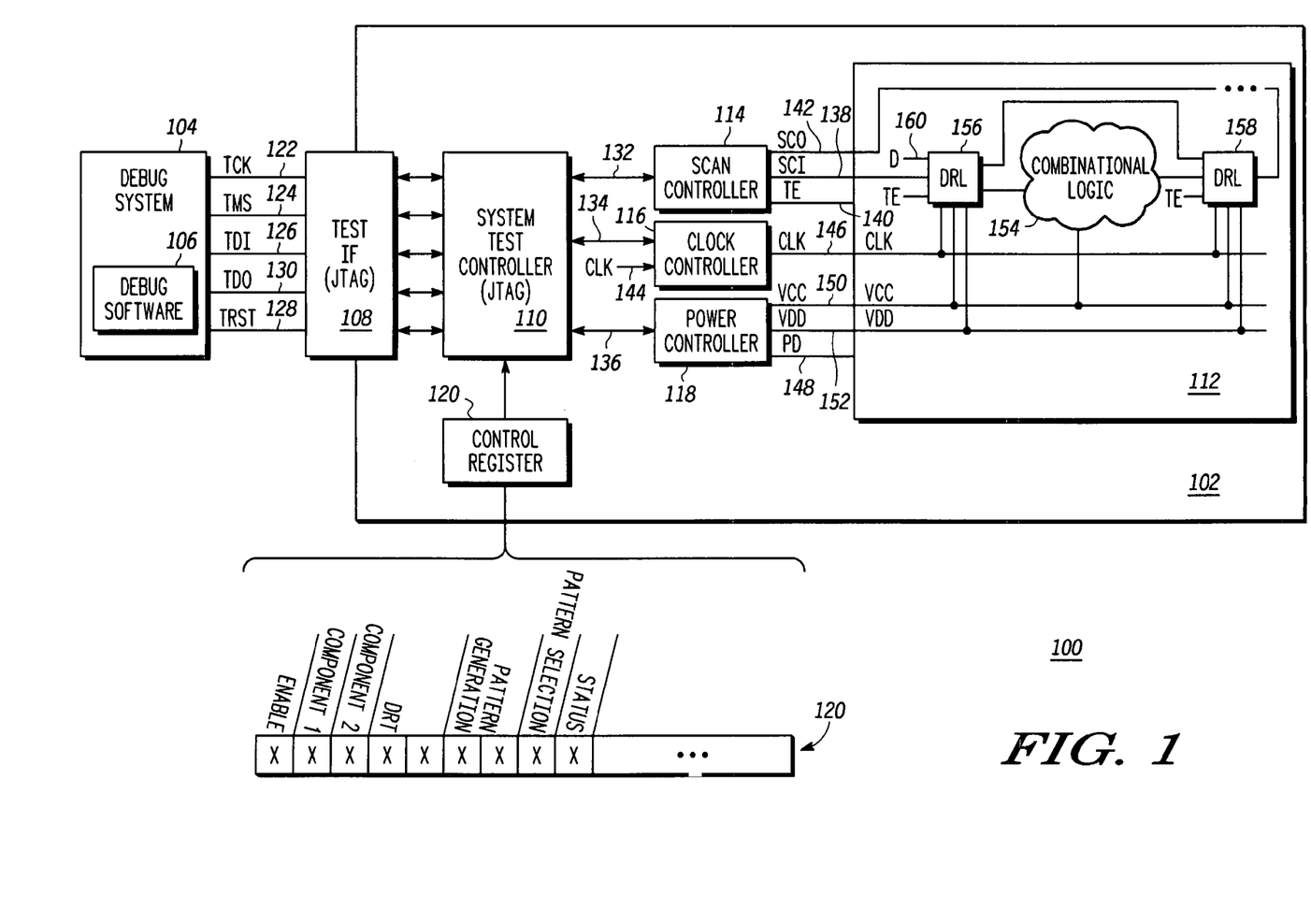
FIG. 1 is a block diagram illustrating an exemplary circuit device having integrated data retention testing capabilities in accordance with at least one embodiment of the present disclosure.

Referring to FIG. 1, an exemplary system 100 utilizing an integrated data retention latch testing scheme is illustrated in accordance with at least one embodiment of the present disclosure. The system 100 includes a circuit device 102 and a debug system 104. The circuit device 102 can include, for example, any of a variety of integrated circuit devices having data retention latches, such as, for example, a microcontroller or microprocessor. The debug system 104 can include, for example, a personal computer or other processing device utilizing debug software 106 or, alternately, debug hardware for the purposes of testing the circuit device 102.

The circuit device 102 includes a test interface 108, a system test controller 110, a circuit component 112 to be tested, a scan controller 114, a clock controller 116, a power controller 118 and a control register 120. The components of the circuit device 102 can be implemented as hardware, firmware, software, or combinations thereof. To illustrate, in one embodiment, the components of the circuit device 102 are implemented as logic to perform the functions described herein.

The test interface 108 can include a custom interface or the test interface 108 can include an interface that is substantially compliant with one or more test scan interface standards, such as the IEEE 1149.1 JTAG standard. For ease of discussion, the test interface 108 is described herein in the context of the IEEE 1149.1 JTAG standard. Accordingly, the test interface 108 includes a plurality of external JTAG inputs, including an input to receive a test clock (TCK) signal 122, an input to receive a test mode select (TMS) signal 124, an input to receive a test data in (TDI) signal 126, and an input to receive a test reset (TRST) signal 128. The test interface 108 further includes an internal input (not shown) to receive output test data from the system test controller 100, an external output to provide a test data out (TDO) signal 130 based on the output test data, and an internal output (not shown) to provide the TCK signal 122, the TMS signal 124, the TDI signal 126 and the TRST signal 128 to the system test controller 110. In at least one embodiment, the external inputs and external output of the test interface 108 are implemented at a set of input/output (I/O) pins of the circuit device 102.

The system test controller 110 includes a plurality of inputs to receive the TCK signal 122, the TMS signal 124, the TDI signal 126 and the TRST signal 128 from the test interface 108 and an input to receive control information represented by a bit value or bit values stored in the control register 120. The system test controller 110 further includes an output to provide a scan test control signal 132, an output to provide a clock control signal 134, and an output to provide a power control signal 136. In one embodiment, the control information represented by the scan test control signal 132, the clock control signal 134, and the power control signal 136 are based on the mode of operation indicated by the control register 120 and based on the test information represented by the TCK signal 122, the TMS signal 124, the TDI signal 126 and the TRST signal 128.

The scan controller 114 has an input to receive the scan test control signal 132 and a plurality of outputs, including an output to provide a scan chain input (SCI) signal 138 and an output to provide a test enable signal 140. The scan controller 114 further includes an input to receive a scan chain output (SCO) signal 142. The scan controller 114 further includes an output (not shown) to provide the data represented by the SCO signal 142 to the system test controller 110. As described in detail herein, in one embodiment, the SCI signal 138 and test enable signal 140 are based on the scan test control signal 132.

The clock controller 116 includes an input to receive the clock control signal 134 and an input to receive a device clock (CLK) signal 144. The clock controller 116 further includes an output to provide a clock (CLK) signal 146, where the CLK signal 146 includes either the device CLK signal 144 or the TCK signal 122 based on the clock control signal 134.

The power controller 118 includes an input to receive the power control signal 136 and a plurality of outputs, including an output to provide a power down (PD) signal 148, an output to provide a first voltage 150 ($V_{CC}$) and an output to provide a second voltage 152 ($V_{DD}$). As described in detail herein, in one embodiment, the PD signal 148 and the first voltage 150 are based on the power control signal 134.

The circuit component 112 includes combinational logic 154 and non-data retention sequential logic (not shown) powered by the first voltage 150. The circuit component 112 further includes a plurality of data retention latches (DRLs), such as data retention latches 156 and 158, to be tested. Each of the data retention latches 156 and 158 includes a plurality of inputs, including a data input to receive a data signal (e.g., data signal 160), a test input to receive a scan chain test input (TI) signal, an enable input to receive the TE signal 140, a clock input to receive the CLK signal 146, a power down input to receive the PD signal 148, and voltage inputs to receive the first voltage 150 and the second voltage 152. Each of the data retention latches 156 and 158 further includes a data output to provide a value latched at the corresponding data retention latch.

As described in detail with reference to FIG. 2, each of the data retention latches 156 and 158, in one embodiment, includes a scan chain component to permit scan chain testing of the data retention latch, a first latch component powered by the first voltage 150 and a second latch component powered by the second voltage 152. Thus, the first voltage 150 can be reduced or shut off, thereby powering down the combinational logic 154 and the first latch component of each of the data retention latches, while the second latch component of each of the data retention latches continues to retain the currently latched value as long as the second voltage 152 remains.

Further, as illustrated by FIG. 1, the data retention latches can be configured to permit scan chain testing. In the depicted example, the test input of the data retention latch 156 is connected to receive the SCI signal 138 and the data output of the data retention latch 156 is connected to an input of the combinational logic 154. Further, the data input of the data retention latch 158 is connected to an output of the combinational logic 154 and the test input of the data retention latch 158 is connected to the data output of the data retention latch 156 so that the data retention latches 156 and 158 form a scan chain for testing purposes. As described herein with reference to FIG. 3, the data retention latches of the circuit component 112 can be arranged in multiple scan chains for testing purposes.

In the depicted example, the control register 120 can include a plurality of bit fields including: an enable bit to enable or disable data retention latch testing, component bits (e.g., component 1 and component 2) to indicate which component of the circuit device 102 is to be tested, data retention test (DRT) mode bits to indicate which stage of testing is to be performed, pattern generation bits to indicate which bit pattern of a plurality of predetermined bit patterns is to be used to generate a test pattern, a pattern selection bit to indicate whether to use an external test pattern supplied as the TDI signal 126 or to use a test pattern generated internally, and a status bit to indicate whether a faulty data retention latch is detected during debugging.

Upon entering an operational mode, the system test controller 110 configures the scan test control signal 132 so as to indicate that the scan controller 114 is to be disabled. In response, the scan controller 114 deasserts the TE signal 140 and gates the SCI signal 138. The system test controller 110 also configures the clock control signal 134 so as to indicate that the clock controller 116 is to function in an operational mode. In response, the clock controller 116 provides a representation of the device CLK signal 144 as the output CLK signal 146. The system controller 110 additionally configures the power control signal 118 so as to indicate that the power controller 118 is to enable full operation. In response, the power controller 118 provides both the first voltage 150 ($V_{CC}$) and the second voltage 152 ($V_{DD}$) and disables certain low-power features, such as disabling power gating by deasserting the PD signal 148. With the TE signal 140 and the PD signal 148 unasserted in the operational mode, the data path of the circuit component 112 including the data retention latches 156 and 158 and the combinational logic 154 operates in response to data inputs and the clock signal 146 and scan chain testing via the TI inputs is disabled.

In a test operation of the circuit device 102, an interface of the debug system 104 is connected to the test interface 108 and the debug system 104 provides the TCK signal 122, the TMS signal 124, the TDI signal 126 and the TRST signal 128. Upon entering a test mode (directed via, for example, a control value of the control register 120), the system test controller 110 executes a testing sequence for debugging the data retention latches of the circuit component 112.

During the first stage of the testing sequence (e.g., DRT=00), the system test controller 110 configures the clock control signal 134 so as to indicate that the clock controller 116 is to bypass the device CLK signal 144. In response, the clock controller 116 selects the TCK signal 122 (provided as, for example, a signal of the clock control signal 134) and provides a representation of the TCK signal 122 as the output CLK signal 146. During the first stage, the system test controller 110 also configures the scan test control signal 132 so as to indicate that the scan controller 114 is to be enabled. In response, the scan controller 114 asserts the TE signal 140 and scans in a test pattern as the SCI signal 138 to the scan chain represented by the data retention latches 156 and 158. In one embodiment, the system test controller 110 (or, alternately, the scan controller 114) automatically generates the test pattern based on a particular pattern indicated by the pattern generation bits of the control register 120. To illustrate, the system test controller 110 can be configured to provide a repeating sequence of 0011 in response to a value of 00 for the pattern generation bits, a repeating sequence of 0101 in response to a value of 01 for the pattern generation bits, a repeating sequence of 1001 in response to a value of 10 for the pattern generation bits, or a repeating sequence of 1111 in response to a value of 11 for the pattern generation bits. Alternately, the test pattern can be based on the TDI signal 126 provided by the debug system 104 (and provided to the scan controller 114 as, for example, a signal of the scan test control signal 132). The system test controller 110 further configures the power control signal 136 so as to direct the power controller to provide both the first voltage 150 and the second voltage 152 to the data retention latches 156 and 158 during the first stage.

After the scan in of the test pattern into the scan chain is completed, the system test controller 110 initiates the second stage of the test (e.g., DRT=01). During the second stage, the system test controller 110 configures the power control signal 136 so as to initiate a power down sequence at the power controller 118. In response, the power controller 118 asserts the PD signal 148 and reduces or eliminates the first voltage 150 ($V_{CC}$) while maintaining the second voltage 152 ($V_{DD}$)(or reducing it to level sufficient to retain the data in the second latch components), thereby shutting down the combinational logic 154 and the first latch components of the data retention latches 156 and 158 while allowing the second latch components of the data retention latches 156 and 158 to maintain their latched values. The system test controller 110 also configures the clock control signal 134 to direct the clock controller 116 to hold the CLK signal 146 low or to gate the CLK signal 146.

During a third stage of the test (e.g., DRT=10), the system test controller 110 configures the power control signal 136 so as to initiate a power up sequence at the power controller 118. In response, the power controller 118 turns on the supply of the first voltage 150 ($V_{CC}$) and deasserts the PD signal 148, thereby re-enabling the first latch component of each of the data retention latches 156 and 158.

During a fourth stage of the test (e.g., DRT=11), the system controller 110 configures the clock control signal 134 so as to direct the clock controller 116 to start providing the output CLK signal 146 again. The system controller 110 also configures the scan test control signal 132 so as to indicate that the scan chain data is to be shifted out. In response, the scan controller 114 shifts out the scan chain data as the SCO signal 142 and provides the output scan chain data to the system test controller 110.

In one embodiment, the system test controller 110 (or, alternately, the scan controller 114) is configured to debug the data retention latches based on the output scan chain data. To illustrate, the system test controller 110 can implement a two-bit comparator to compare each bit of the output scan chain data with the corresponding bit of a predetermined debug bit sequence. In the event that there is a mismatch, the system test controller 110 can set the status bit of the control register 120 to indicate that there is a faulty data retention latch. In an alternate embodiment, the output scan chain data is provided to the debug system 104 via the test interface 108 as the TDO signal 130 and the debugging software 106 performs the comparison of the output scan chain data to the predetermined debug bit sequence to determine which of the data retention latches may be faulty.

Figure 2:
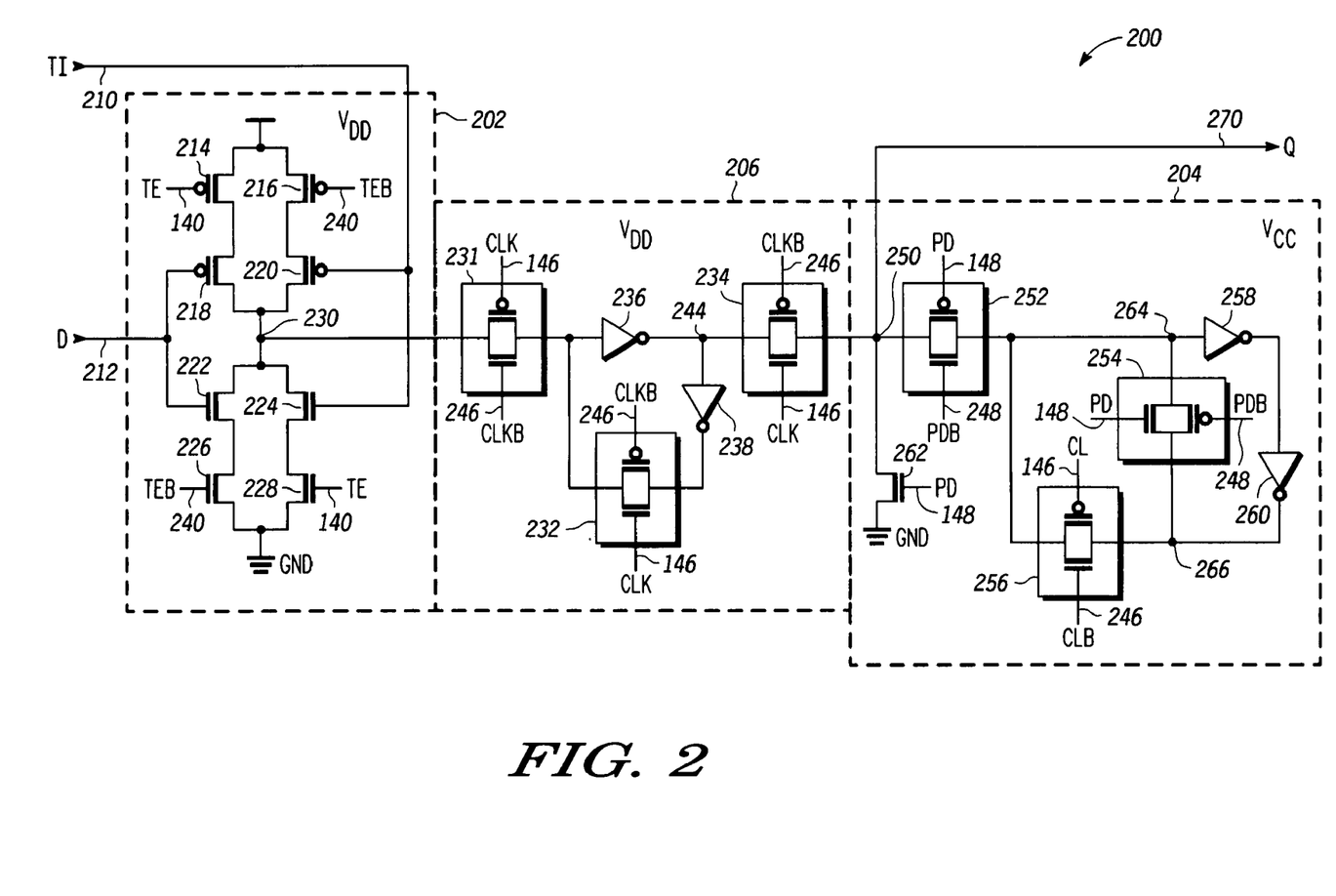
FIG. 2 is a circuit diagram illustrating an exemplary implementation of a data retention latch in accordance with at least one embodiment of the present disclosure.

Referring to FIG. 2, an exemplary implementation of the data retention latches 156 and 158 of FIG. 1 is illustrated in accordance with at least one embodiment of the present disclosure and referred to herein as data retention latch 200. In the illustrated example, the data retention latch 200 includes a scan chain component 202, a first latch component 204 and a second latch component 206. The first latch component 204 is powered by the first voltage 150 ($V_{CC}$) (FIG. 1) and the scan chain component 202 and the second latch component are powered by the second voltage 152 ($V_{DD}$)(FIG. 1).

The scan chain component 202 includes a test input to receive the TE signal 210, a data input to receive a data signal 212, and a plurality of transistors 214, 216, 218, 220, 222, 224, 226 and 228, where the transistors 214, 216, 218 and 220 are p-type transistors and the transistors 222, 224, 226, and 228 are n-type transistors.

The transistor 214 includes a control electrode to receive the TE signal 140, a first current-carrying electrode coupled to a first voltage reference (e.g., $V_{DD}$), and a second current-carrying electrode. The transistor 216 includes a control electrode to receive an inverted representation of the TE signal (hereinafter, the TEB signal 240), a first current-carrying electrode coupled to the first voltage reference, and a second current-carrying electrode. The transistor 218 includes a control electrode to receive the data signal 212, a first current-carrying electrode coupled to the second current-carrying electrode of the transistor 214, and a second current-carrying electrode coupled to a node 230. The transistor 220 includes a control electrode to receive the TI signal 210, a first current-carrying electrode coupled to the second current-carrying electrode of the transistor 216, and a second current-carrying electrode coupled to the node 230.

The transistor 222 includes a control electrode to receive the data signal 212, a first current-carrying electrode coupled to the node 230, and a second current-carrying electrode. The transistor 224 includes a control electrode to receive the TI signal 210, a first current-carrying electrode coupled to the node 230, and a second current-carrying electrode. The transistor 226 includes a control electrode to receive the TEB signal 240, a first current-carrying electrode coupled to the second current-carrying electrode of the transistor 222, and a second current-carrying electrode coupled to a second voltage reference (e.g., GND). The transistor 228 includes a control electrode to receive the TE signal 140, a first current-carrying electrode coupled to the second current-carrying electrode of the transistor 224 and a second current-carrying electrode coupled to the second voltage reference.

The second latch component 202 includes pass gates 231, 232 and 234 having gate inputs to receive the CLK signal 146 (FIG. 1) and an inverted representation of the CLK signal 146 (hereinafter, the CLKB signal 246). The second latch component 202 further includes inverters 236 and 238. The pass gate 231 has a data input coupled to the node 230 and a data output coupled to a node 242. The inverter 236 has an input coupled to the node 242 and an output coupled to a node 244 and inverter 236 has an input coupled to the node 244 and an output. The pass gate 232 has a data input coupled to the output of the inverter 236 and an output coupled to the node 242. The pass gate 234 has an input coupled to the node 244 and an output coupled to a node 250. The node 250, in turn, is coupled to the data output (Q) of the data retention latch 200 and provides the output data signal 270.

The first latch component 204 includes pass gates 252 and 254 having gate inputs to receive the PD signal 148 and an inverted representation of the PD signal 148 (hereinafter, the PDB signal 248) and a pass gate 25 having gate inputs to receive the CLK signal 146 and the CLKB signal 246. The first latch component 204 further includes inverters 258 and 260 and n-type transistor 262. The pass gate 252 has a data input coupled to the node 250 and a data output coupled to a node 264. The pass gate 254 has a data input coupled to the node 264 and a data output coupled to a node 266. The pass gate 256 has a data input coupled to the node 266 and a data output coupled to the node 264. The inverter 258 has an input coupled to the node 264 and an output. The inverter 260 has an input coupled to the output of the inverter 258 and an output coupled to the node 266. The transistor 148 has a control electrode to receive the PD signal 148, a first current-carrying electrode coupled to the node 250 and a second current-carrying electrode coupled to the second voltage reference (e.g., GND).

During functional operation, the TE signal 140 and the PD signal 148 are unasserted and the TEB signal 240 and the PDB signal 248 are asserted. Consequently, the data signal 212 is latched into the first data component 204 and the second data component 204 in response to the CLK signal 146 and the CLKB signal 246 assuming that the data retention latch 200 isn't faulty.

During the scan in stage of testing, the TE signal 140 and the PDB signal 248 are asserted and the TEB signal and the PD signal 148 are unasserted. Consequently, the TI signal 210 is latched into the first latch component 204 and the second latch component 206 in response to the CLK signal 146 and the CLKB signal 246 and the latched value is provided as the output data signal 270 assuming that the data retention latch 200 isn't faulty.

During the power down stage of testing, the first voltage is reduced or eliminated, thereby shutting down the components of the first latch component 204. Further, the PD signal 148 and the TE signal 140 are asserted and the PDB signal 248 and the TEB signal 240 are unasserted. Consequently, the data latched at the second latch component 206 is retained during the power down stage assuming that the data retention latch 200 isn't faulty.

During the power up stage of testing, the first voltage is reapplied, thereby powering the components of the first latch component 204. The PDB signal 248 and the TE signal 140 are asserted and the PD signal 148 and the TEB signal 240 are unasserted. Consequently, the latched output at the node 250 is latched by the first latch component 204 assuming that the data retention latch 200 isn't faulty.

During the scan out phase of testing, the latched data value is provided as the data output signal 270 to the test input (TI signal 210) of the next data retention latch of the scan chain. In the event that the data retention latch 200 is the last latch in the scan chain, the output data signal 270 is provided as the SCO signal 142 (FIG. 1).

Figure 3:
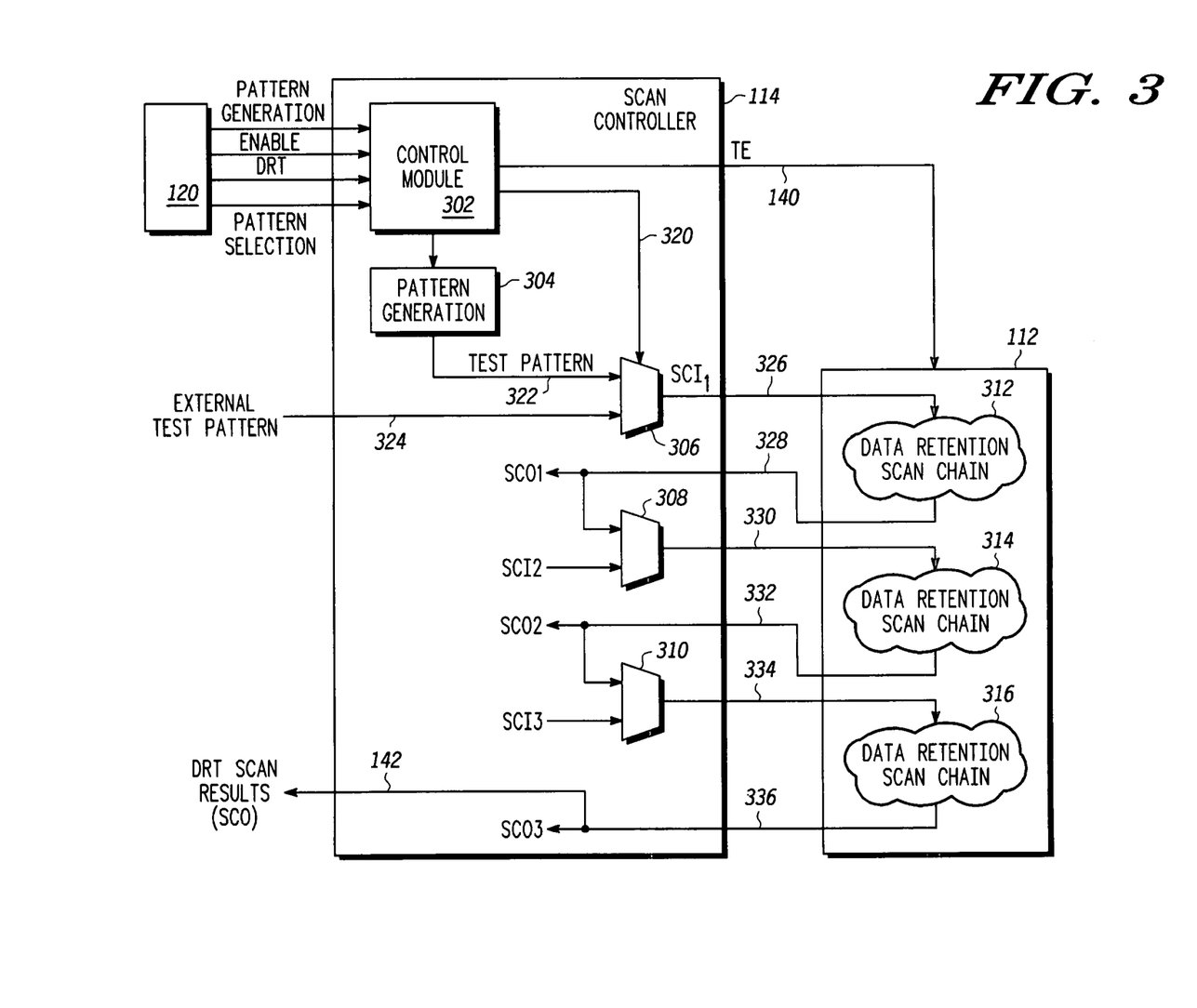
FIG. 3 is a block diagram illustrating an exemplary implementation of a scan controller of the circuit device of FIG. 1 in accordance with at least one embodiment of the present disclosure.

Referring to FIG. 3, an exemplary implementation of the scan controller 114 for sequenced scan chain testing is illustrated in accordance with at least one embodiment of the present disclosure. The scan controller 114 includes a control module 302, a test pattern generation module 304, and a plurality of chain select multiplexers 306, 308 and 310. In the illustrated example, the data retention latches of the device component 112 (FIG. 1) are arranged in a plurality of scan chains, including scan chains 312, 314 and 316.

The control module 302 includes an input to receive the value of the control register 120 (either directly or as part of the scan test control signal 132, FIG. 1), including the pattern generation bits, the enable bit, the DRT mode bits, and the pattern selection bit. The control module 302 further includes an output to provide the TE signal 140, and a mux select signal 320 provided to the chain select multiplexers 306, 208 and 310.

In the illustrated embodiment, the scan chain select multiplexers 306, 308 and 310 are used either to provide separate test patterns to each of the scan chains 312, 314, and 316 or to chain together scan chains by providing the scan chain result data from one scan chain as the test pattern for the next scan chain in the sequence. To illustrate, the scan test data signal 326 is input to the scan chain 312 and the resulting scan chain result signal 328 is output by the scan chain 312. The scan chain result signal 328 then can be provided as the SCO signal 142 (FIG. 1), or the scan chain result signal 328 can be routed via the chain select multiplexer 308 as the scan test data signal 330 input to the scan chain 314. In a similar manner, the scan chain result signal 332 output by the scan chain 314 can be provided as the SCO signal 142 or it can be routed via the chain select multiplexer 310 as the scan test data signal 334 input to the scan chain 316. The scan chain result signal 336 output by the scan chain 316 likewise can be provided as the SCO signal 142 or it can be routed to another scan chain (not shown).

As also illustrated by FIG. 3, the pattern generation module 304 can be used to provide automatic test pattern generation internal to the circuit device 102. For ease of illustration, FIG. 3 depicts an implementation wherein either an internally generated test pattern signal 322 or an externally-supplied test pattern signal 324 (supplied as, for example, the TDI signal 126 of FIG. 1) is provided as the scan test data signal 326 to the scan chain 312 via the chain select multiplexer 306. In the event that the enable bit indicates that data retention testing is enabled and the pattern selection bit indicates that an internally generated test pattern is to be generated, the pattern generation module 304 generates scan chain test data based on a test pattern indicated by the pattern generation bits. As described above, the pattern generation module 304 can generate a test pattern that represents a repeating bit sequence selected based on the pattern generation bits. The resulting test pattern is output as test pattern signal 322.

Figure 4:
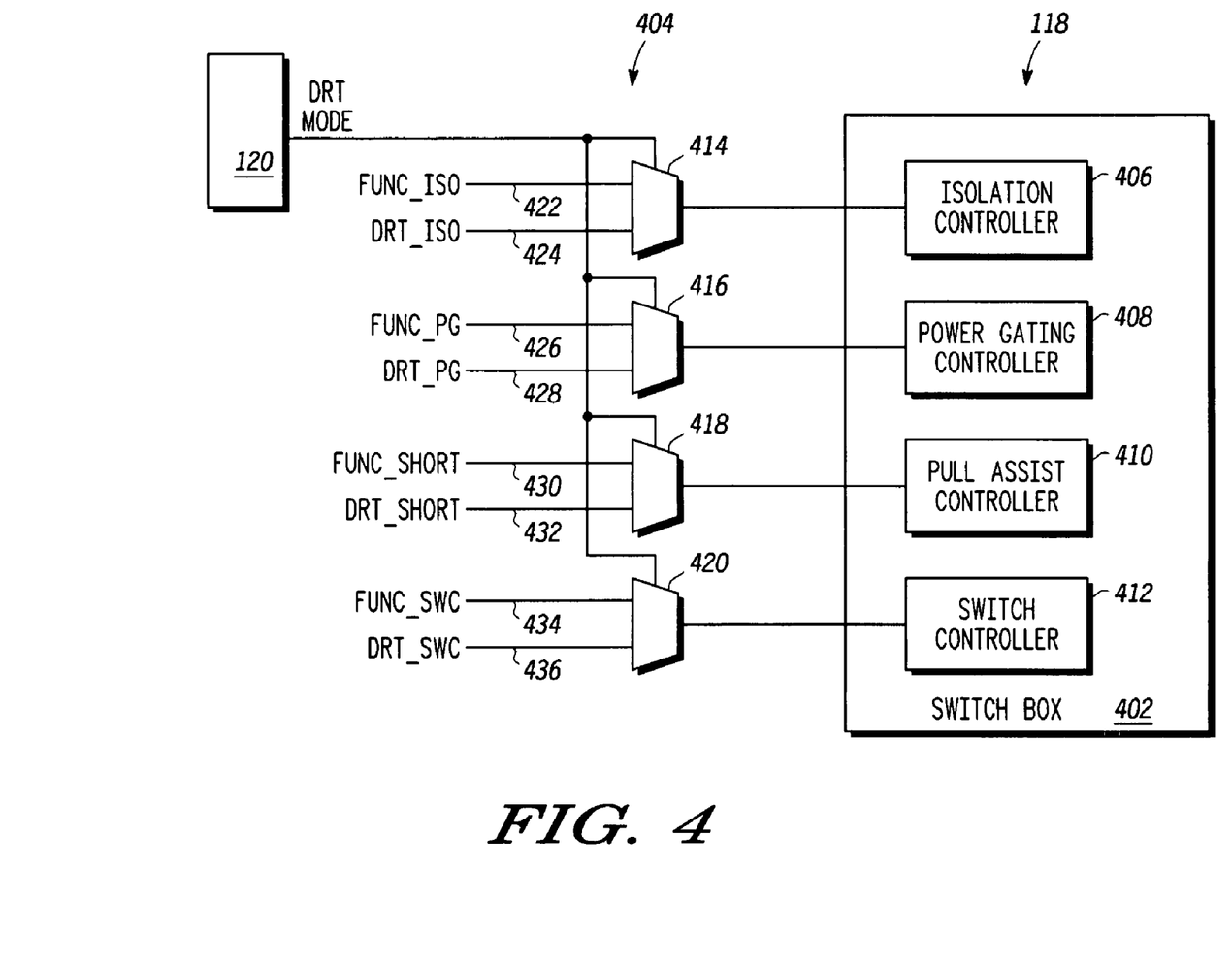
FIG. 4 is a block diagram illustrating an exemplary implementation of a power controller of the circuit device of FIG. 1 in accordance with at least one embodiment of the present disclosure.

Referring to FIG. 4, an exemplary implementation of the power controller 118 is illustrated in accordance with at least one embodiment of the present disclosure. In the depicted example, the power controller 118 includes a switch box 402 and mode select circuitry 404.

The mode select circuitry includes multiplexers 414, 416, 418 and 420, each multiplexer having a select input to receive the DRT mode bits of the control register 120. The multiplexer 414 receives a func_iso signal 422 representative of isolation control during functional operation and a DRT_iso signal 424 representative of isolation control during DRT operation and selects between the two signals 422 and 424 based on the DRT mode bits. The multiplexer 416 receives a func_pg signal 426 representative of power gating control during functional operation and a DRT_pg signal 428 representative of power gating control during DRT operation and selects between the two signals 426 and 428 based on the DRT mode bits. The multiplexer 418 receives a func_short signal 430 representative of pull assist control during functional operation and a DRT_short signal 432 representative of pull assist control during DRT operation and selects between the two signals 430 and 432 based on the DRT mode bits. The multiplexer 420 receives a func_swc signal 434 representative of switch control during functional operation and a DRT_swc signal 436 representative of switch control during DRT operation and selects between the two based on the DRT mode bits.

As described above, due to the multiple voltage domains in which the data retention latches operate, it typically is desirable to carefully manage the power down sequence and the power up sequence of the data retention latches during a testing operation so as to prevent spurious results that occur due to disturbances at the data retention latches. Accordingly, the switch box 402 includes an isolation controller 406, a power gating controller 408, a pull assist controller 410 and a switch controller 412 to control the power down sequence and the power up sequence so as to reduce or eliminate spurious results.

The isolation controller 406 has an input to receive the output signal of the multiplexer 414. In response to the control signal output by the multiplexer 414 indicating a power down sequence, the control isolation controller 406 initiates an isolation process for the data retention latches of the circuit component 112 (FIG. 1). In response to the control signal output by the multiplexer 414 indicating a power up sequence, the control isolation controller 406 terminates the isolation process for the data retention latches of the circuit component 112.

The power gating controller 408 has an input to receive the output signal of the multiplexer 416. In response to the control signal output by the multiplexer 416 indicating the power down sequence, the power gating controller 408 initiates a power gating process for the data retention latches of the circuit component 112 by asserting the PD signal 148 (FIG. 1). In response to the control signal output by the multiplexer 416 indicating the power up sequence, the power gating controller 408 terminates the power gating process for the data retention latches of the circuit component 112 by deasserting the PD signal 148.

The pull assist controller 410 has an input to receive the output signal of the multiplexer 418. In response to the control signal output by the multiplexer 418 indicating the power down sequence, the pull assist controller 410 initiates a pull assist process for the data retention latches of the circuit component 112. In response to the control signal output by the multiplexer 418 indicating the power up sequence, the pull assist controller 410 terminates the pull assist process for the data retention latches of the circuit component 112.

The switch controller 412 has an input to receive the output signal of the multiplexer 420. In response to the control signal output by the multiplexer 420 indicating the power down sequence, the switch controller 412 enables switching for the data retention latches of the circuit component 112. In response to the control signal output by the multiplexer 420 indicating the power up sequence, the switch controller 412 disables switching for the data retention latches of the circuit component 112.

In one embodiment, the power down stage is implemented in the following sequence: initiation of the isolation process; initiation of the power gating process; enabling switching; initiation of the pull assist process; and termination of the power gating process. Further, in one embodiment, the power up stage is implemented in the following sequence: termination of the power gating process; termination of the pull assist process; disabling switching; termination of the power gating process; and termination of the isolation process. Other sequences for the power down stage and the power up stage may be utilized without departing from the scope of the present disclosure.

Figure 5:
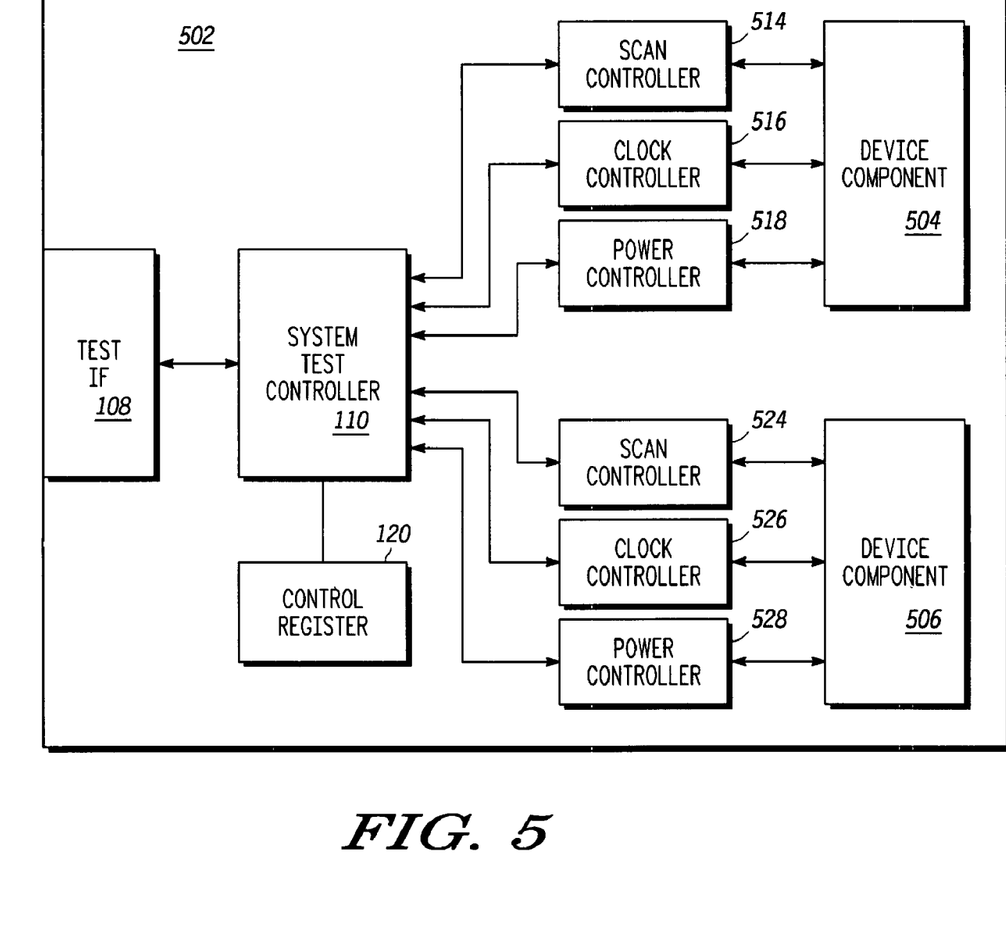
FIG. 5 is a block diagram illustrating an exemplary circuit device having multiple testable circuit components in accordance with at least one embodiment of the present disclosure.

Referring to FIG. 5, another exemplary implementation of a circuit device 502 utilizing embedded data retention testing is illustrated in accordance with at least one embodiment of the present disclosure. As with the circuit device 102 of FIG. 1, the circuit device 502 includes the test interface, the system test controller 110 and the control register 110. Further, the circuit device 502 includes multiple device components (e.g., device components 504 and 506) that are scan chain testable for data retention latch debugging purposes. Accordingly, the system test controller 110 acts as an arbiter between the scan controller 514, the clock controller 516 and the power controller 518 associated with the device component 504 and the scan controller 524, the clock controller 526, and the power controller 528 associated with the device component 506. As illustrated by FIG. 1, the control register can include one or more device component bits that can be set to indicate which device component is under test.

Figure 6:
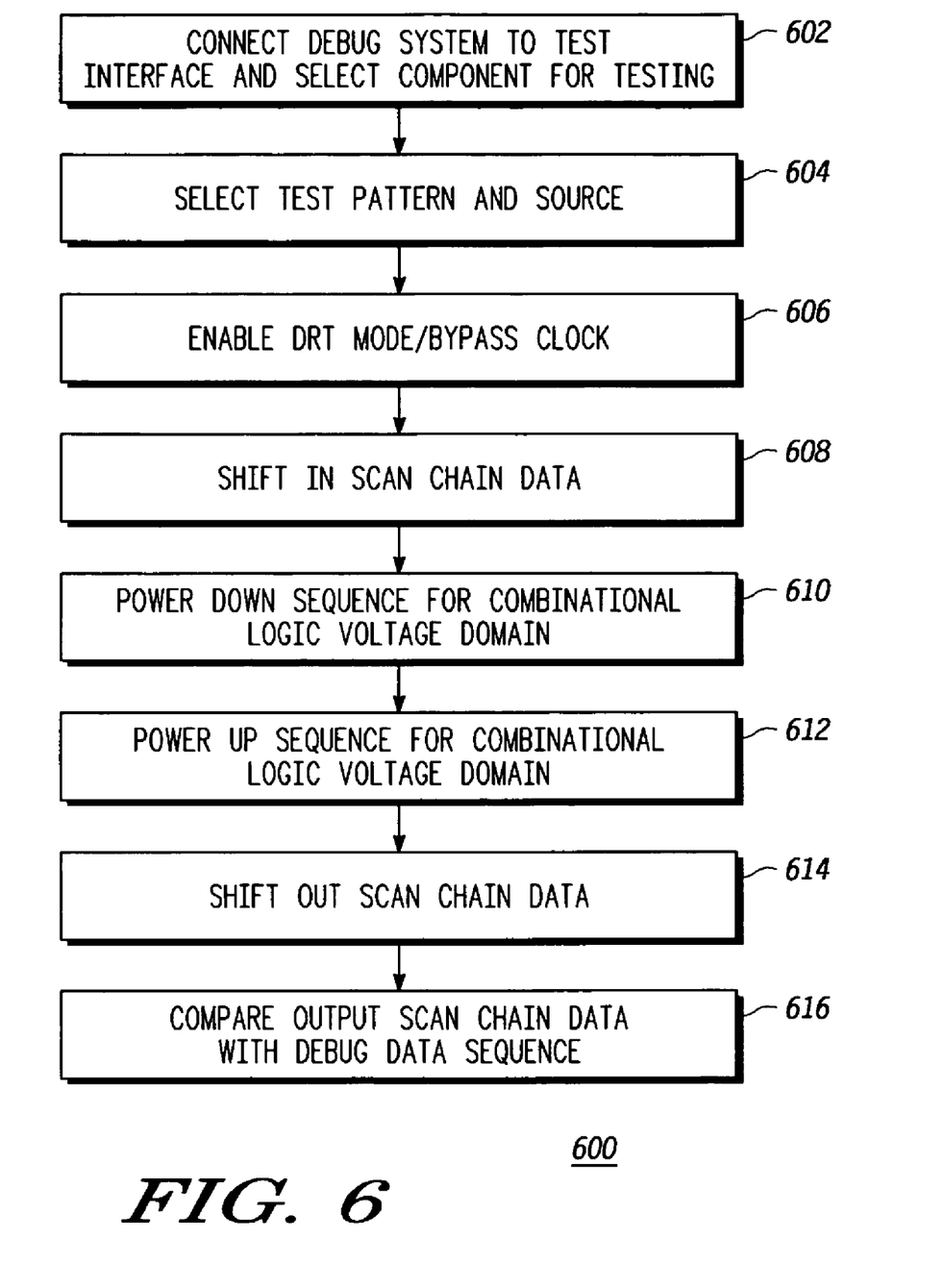
FIG. 6 is a flow diagram illustrating an exemplary method for testing data retention latches in a circuit device in accordance with at least one embodiment of the present disclosure.

Referring to FIG. 6, an exemplary method for debugging a circuit device having dual-voltage domain data retention latches is illustrated in accordance with at least one embodiment of the present disclosure. The method 600 includes connecting an interface of a debug system to the test interface of a circuit device and selecting a component of the circuit device for scan chain testing at block 602. In one embodiment, the test interface is substantially compliant with an industry standard, such as the IEEE 1149.1 JTAG standard.

At block 604, a test pattern and source are selected. In one embodiment, the debugging system is the source of a predetermined test pattern. In an alternate embodiment, the circuit device generates a repeating bit sequence as the test pattern. At block 606, the circuit device enables a data retention testing (DRT) mode and bypasses the device clock by using a test clock supplied by the debugging system. The test clock is provided to the scan chain under test. At block 608, the circuit device shifts in the selected test pattern as scan chain data into the scan chain under test based on either the rising edge or falling edge of the test clock.

At block 610, the circuit device initiates a power down sequence for the circuit device. The power down sequence includes terminating the supply of voltage to the combinational logic, other types of sequential logic, and a first latch component of each of the data retention latches in the scan chain. Further, voltage continues to be supplied to a second latch component and scan chain component of the data retention latches of the scan chain. At block 612, the method 600 includes initiating a power up sequence for the circuit device. The power up sequence includes reinitiating the supply of voltage to the combinational logic, other types of sequential logic, and the first latch components of the data retention latches under test.

At block 614, the data in the scan chain is shifted out using the test clock and at block 616 the output scan chain results are compared with a predetermined debug data sequence to determine whether a data retention latch has faulty operation. As discussed above, the comparison of the output scan chain results with the debug data sequence may be performed by the circuit device itself (using, e.g., a two-bit comparator), or the comparison may be performed by hardware or software at the debugging system connected to the test interface of the circuit device.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A circuit device comprising:
a circuit component having a plurality of data retention latches, each data retention latch having a scan chain component, a first latching component operated at a first voltage and a second latching component operated at a second voltage different than the first voltage;
a scan controller having a first input to receive a scan test control signal, a first output coupled to the circuit component to provide a first scan chain data to the scan chain components of the plurality of data retention latches responsive to the scan test control signal, a second input coupled to the circuit component to receive a second scan chain data from the scan chain components of the plurality of data retention latches based on the first scan chain data, and a second output to provide the second scan chain data;
a power controller having an input to receive a power control signal, a first output to selectively provide the first voltage responsive to the power control signal, and a second output to selectively provide the second voltage responsive to the power control signal;
a test interface having a first input to receive scan test data and an output to provide test results data;
a system test controller coupled to the test interface, the system test controller including a first input coupled to the second output of the scan controller to receive the second scan chain data, wherein the test results data includes the second scan chain data, a first output coupled to a third input of the scan controller to provide the scan test data, wherein the scan test data includes the first scan chain data, a second output coupled to the first input of the scan controller to provide the scan test control signal, and a third output coupled to the input of the power controller to provide the power control signal.

2. The circuit device of claim 1, wherein:
the test interface further includes a second input to receive a first clock signal;
the circuit device further comprises a clock controller having a first input to receive the first clock signal, a second input to receive a clock control signal, and an output coupled to the circuit component to selectively provide one of the first clock signal or a second clock signal based on the clock control signal; and
the system test controller further comprises a fourth output coupled to the second input of the clock controller to provide the clock control signal.

3. The circuit device of claim 2, wherein:
the test interface further includes a third input to receive a mode select signal; and
the scan controller is to provide the scan test control signal, the power control signal and the clock control signal responsive to the mode select signal.

4. The circuit device of claim 1, wherein:
a first subset of the plurality of data retention latches are arranged in a first scan chain and a second subset of the plurality of data retention latches are arranged in a second scan chain; and the scan controller includes a first output to provide a third scan data to an input of the first scan chain, an input to receive a fourth scan data from an output of the first scan chain, an output to provide the fourth scan data to an input of the second scan chain and an input to receive a fifth scan data from an output of the second scan chain.

5. The circuit device of claim 1, wherein the test interface is substantially compliant with a test scan interface standard.

6. The circuit device of claim 5, wherein the test scan interface standard includes the IEEE 1149.1 JTAG standard.

7. The circuit device of claim 1, further comprising:
a control register having a first bit field to store a stage value, wherein a stage of scan chain testing at the circuit device is controlled by the stage value.

8. A method comprising:
receiving, at a test interface of a circuit device, scan test data;
providing a first voltage and a second voltage to a sequence of data retention latches, each data retention latch having a corresponding scan chain component of a scan chain, a first latching component operated at the first voltage, and a second latching component operated at the second voltage;
shifting a first scan test data into the scan chain subsequent to providing the first voltage and the second voltage;
terminating provision of the first voltage to the first latching components of the sequence of data retention latches subsequent to shifting the scan test data into the scan chain;
providing the first voltage to the first latching components of the sequence of data retention latches subsequent to terminating provision of the first voltage; and
shifting a second scan test data out of the scan chain subsequent to providing the first voltage, wherein the second scan test data is based on the first scan test data.

9. The method of claim 8, further comprising:
receiving, at the test interface, a test clock signal; and
controlling the shifting of the first scan test data into the scan chain and the shifting of the second scan test data out of the scan chain based on the test clock signal.

10. The method of claim 8, further comprising:
continuing provision of the second voltage between the shifting of the first scan test data into the scan chain and shifting the second scan test data out of the scan chain.

11. The method of claim 8, further comprising:
comparing the second scan test data with debug data to determine whether at least one of the data retention latches has failed.

12. The method of claim 8, wherein the test interface is substantially compliant with a test scan interface standard.

13. The method of claim 12, wherein the test scan interface standard includes the IEEE 1149.1 JTAG standard.

14. The method of claim 8, wherein terminating provision of the first voltage further includes terminating provision of the first voltage to combinational logic associated with the sequence of data retention latches.

15. The method of claim 14, wherein terminating provision of the first voltage further includes terminating provision of the first voltage to sequential logic associated with the sequence of data retention latches.

16. The method of claim 8, further comprising:
generating, at the circuit device, a test pattern based on a repeating bit sequence, wherein the first scan test data is based on the test pattern.

17. The method of claim 8, further comprising:
accessing, at the circuit device, a control register, wherein the control register includes a first bit field to indicate a stage of scan chain testing for the circuit device.

18. A device comprising:
a test interface to receive scan test data;
a scan chain comprising a sequence of data retention latches, each data retention latch having a corresponding scan chain component of a scan chain, a first latching component operated at a first voltage, and a second latching component operated at a second voltage;
means for providing the first voltage and the second voltage to the sequence of data retention latches;
means for shifting a first scan test data into the scan chain subsequent to providing the first voltage and the second voltage;
means for terminating provision of the first voltage to the first latching components of the plurality of data retention latches subsequent to shifting the scan test data into the scan chain;
means for providing the first voltage to the second latching components of the plurality of data retention latches subsequent to terminating provision of the first voltage; and
means for shifting a second scan test data out of the scan chain subsequent to providing the first voltage, wherein the second scan test data is based on the first scan test data.

19. The system of claim 18, further comprising:
means for controlling the shifting of the first scan test data into the scan chain and the shifting of the second scan test data out of the scan chain based on a test clock signal.

20. The system of claim 18, further comprising:
means for generating a test pattern, the first scan test data based on the test pattern.

* * * * *